United States Patent

Lemelson

[11] Patent Number: 5,255,929
[45] Date of Patent: Oct. 26, 1993

[54] BLADE FOR ICE SKATE

[76] Inventor: Jerome H. Lemelson, 48 Parkside Dr., Princeton, N.J. 08540

[21] Appl. No.: 494,689

[22] Filed: Mar. 16, 1990

Related U.S. Application Data

[63] Continuation-in-part of Ser. No. 32,352, Mar. 31, 1987, Pat. No. 4,859,493.

[51] Int. Cl.[5] ............................................. A63C 1/30
[52] U.S. Cl. ............................. 280/11.18; 280/11.12
[58] Field of Search .................. 280/11.12, 841, 11.14, 280/11.18; 51/293, 297, 298, 295, 306

[56] References Cited

U.S. PATENT DOCUMENTS

| | | | |
|---|---|---|---|
| 3,276,852 | 10/1966 | Lemelson | 51/298 |
| 3,967,832 | 7/1976 | Chambers | 280/11.12 |
| 4,131,288 | 12/1978 | Wilson | 280/11.12 |

Primary Examiner—Andres Kashnikow
Assistant Examiner—Richard Camby

[57] ABSTRACT

Improvements in ice skates, particularly ice skate blades which are protected against wear and dulling during use. In one form, a thin film of hard synthetic diamond or diamond-like material is formed in situ against the lower portion of an ice skate blade including the bottom surface thereof and portions of the side walls of the blade so as to define the left and right edges of the blade of a hard material which is resistant to erosion and wear. In another form, the entire blade of an ice skate is coated with such hard diamond material formed from atoms of carbon deposited from a fluid containing hydrocarbon molecules, such as methane gas through which high energy radiation, such as microwave radiation, is beamed against the blade. In a third form, the entire blade runner and the metal support for the blade are coated with a hard synthetic diamond or diamond-like material. In yet another form, the diamond or diamond-like material coated on the blade or select portion thereof, is overcoated with a thin layer of a protecting material, such as chromium or a chromium alloy, which protects the outer surface of the synthetic diamond material from surface erosion and abrasion.

15 Claims, 1 Drawing Sheet

BLADE FOR ICE SKATE

RELATED APPLICATIONS

This is a continuation-in-part of copending application Ser. No. 032,352 filed Mar. 31, 1987, now U.S. Pat. No. 4,859,493.

SUMMARY OF THE INVENTION

This invention relates to new and improved structures in blades, such as ice skate blades and the like, subject to wear and abrasion during use. In one form, the blade or runner portion of an ice skate blade assembly is formed of a metal, such as aluminum or steel, having a flat or convex lower surface and flat parallel side walls joining the lower surface at respective elongated edges thereof, which edges are configured to permit maximum skating efficiency on ice. A hard synthetic diamond coating is deposited as atoms of carbon separated from carbon containing molecules, such as methane gas molecules disposed adjacent the bottom and side wall surfaces of the blade while intense radiation, such as microwave energy, is directed through the gas and against the surfaces of the blade. An overcoating of a solid lubricant, such as chromium or a chromium plating, is vapor or electrodeposited against the outer surface of the synthetic diamond coating on the blade. In a particular form, such coatings extend completely across and around all surfaces of the blade after it is formed and prior to welding same to a hollow retaining portion of a blade support which is secured to the bottom of the skate shoe. In another form, the coating material or materials are disposed merely against the bottom surface of the blade and select limited portions of the side walls thereof so as to define a wear resistant bottom surface and elongated left and right edges formed of such material or materials. In a third form, both the blade and its support, after assembly and welding, are subjected to one or more coating procedures which deposit a hard synthetic diamond film against the side walls and bottom wall of the blade as well as the support structure assembled therewith so as to strengthen the entire structure and protect the surfaces thereof, including the longitudinal edges of the blade, from wear and corrosion.

Accordingly it is a Primary object of this invention to provide new and improved structures in ice skate assemblies.

Another object is to provide a new and improved structure in an ice skate blade.

Another object is to provide an improved ice skate blade having its bottom surface and the longitudinal edge portion defined by a hard synthetic diamond material.

Another object is to provide an improved ice skate blade having its bottom surface and the longitudinal edge portions defined by a hard synthetic diamond material and an overcoating of a solid lubricant protecting such hard synthetic diamond material.

Another object is to provide an improved ice skate blade having its bottom surface and the longitudinal edge portion defined by a hard synthetic diamond material and an overcoating of hard metal protecting such hard synthetic diamond material wherein such overcoating is formed of chromium.

Another object is to provide a new and improved structure in an ice skate blade having a hard diamond material coating the bottom surface and side walls of the main portion of the blade which normally contacts ice during sliding travel of the skate as well as the toe picks at the front end of the blade which are employed to engage the ice when stopping.

With the above and such other objects in view as may hereinafter more fully appear, the invention consists of the novel structures, articles constructions and methods described in the accompanying specification and illustrated in the drawings, but it is to be understood that variations and modifications may be resorted to which fall within the scope of the invention as claimed without departing from the nature and spirit of the invention.

BRIEF DESCRIPTION OF THE DRAWINGS

In FIG. 1 is illustrated typical male and female ice skates 10M and 10, the female skate 10 being shown in greatest detail as comprising a skate shoe 11 conventionally fabricated with a side wall 12 and a bottom wall 13 formed with a heel portion 14 and a forward sole portion 15, both being of sufficient rigidity and strength to support a skate blade assembly 20 secured to such heel and sole portions by suitable fasteners. The blade assembly 20 includes an elongated flat blade portion 21, preferably stamped of steel, aluminum alloy, titanium or other suitable metal. The blade portion 21 may also be machined of steel strip or plate or perhaps even molded of suitable metal or high strength plastic or filament reinforced plastic such as carbon-carbon plastic filament composite. Conventional tubular metal or plastic fastening fittings 16,17 and 18 are welded or otherwise secured to upwardly extending finger-like portions 22,23 and 24 of the blade to support the blade away from the bottom of the shoe as shown and are each secured to the bottom wall of the shoe 11 including the heel and sole thereof.

Figure 2:
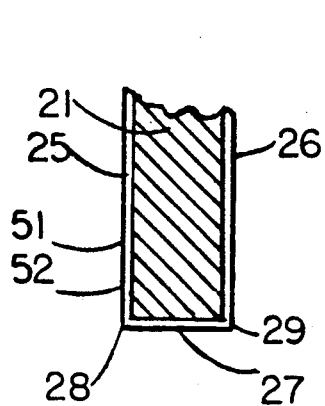
FIG. 2 is an end cross sectional view of the blade of the skate of FIG. 1.
Figure 3:
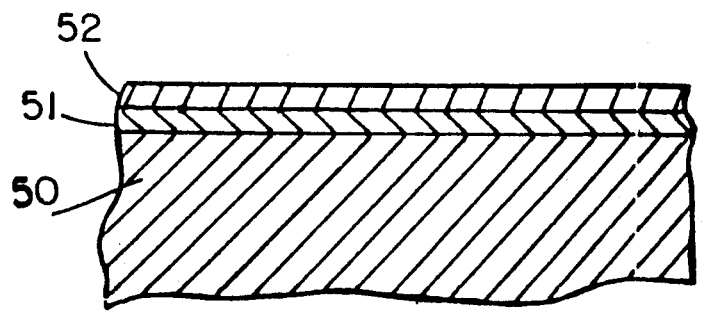
FIG. 3 is a fragmentary view in cross section of typical blade and coating construction.

As shown in the enlarged cross sectional view of FIG. 2, the blade 21 has parallel flat side walls 25 and 26 and a bottom wall 27 which is either flat and at right angles to the side walls or is concavely shaped to better define the side edges 28 and 29 of the blade.

Shown coating the side walls 25 and 26 as well as the bottom wall 27 of the blade 21 and extending over and around the longitudinal side edge portions 28 and 29 thereof is a thin layer 51 of synthetic diamond material formed in situ thereon by chemical vapor deposition of carbon atoms stripped from molecules of a hydrocarbon gas, such as methane or other suitable carbon atom containing fluid disposed adjacent the blade as both the gas and blade are subjected to suitable microwave energy as in the process described in my U.S. Pat. No. 4,859,493 and copending patent application Ser. No. 032,352 filed Mar. 31, 1987.

In one form of the invention, the synthetic diamond coating 51 is deposited as a thin layer of constant thickness against the entire outer surface of the blade 21 and any supporting fitting or fittings welded thereto. In another form, such coating extends just along the lower portion of the blade including the lower parts of the side wall surfaces 25 and 26 and bottom wall 27 thereof defining therewith the parallel longitudinally extending side edges 28 and 29 thereof. Such latter coating may be limited to the runner portions of the blade which contact the ice during normal skating or may also extend to the front end portion 30 of the blade which includes toe pick formations 31 or the forward point of the blade (not shown) which is employed for sudden stopping by digging same into the ice.

Shown overcoating the synthetic diamond coating 51 of the blade is a thin protective coating 52 of metal such as chromium or other suitable metal or alloy which serves to protect the outer surface of the diamond coating 51 and act as a friction reducing dry lubricant. While the synthetic diamond material defines and preserves the longitudinally extending edges 28 and 29 of the blade from dulling such a chromium coating which may be applied by chemical vapor deposition utilizing the same microwave energy used to coat form the synthetic diamond coating or by electro-plating, protects the lubricates the outer surface of the diamond coating.

Figure 1:
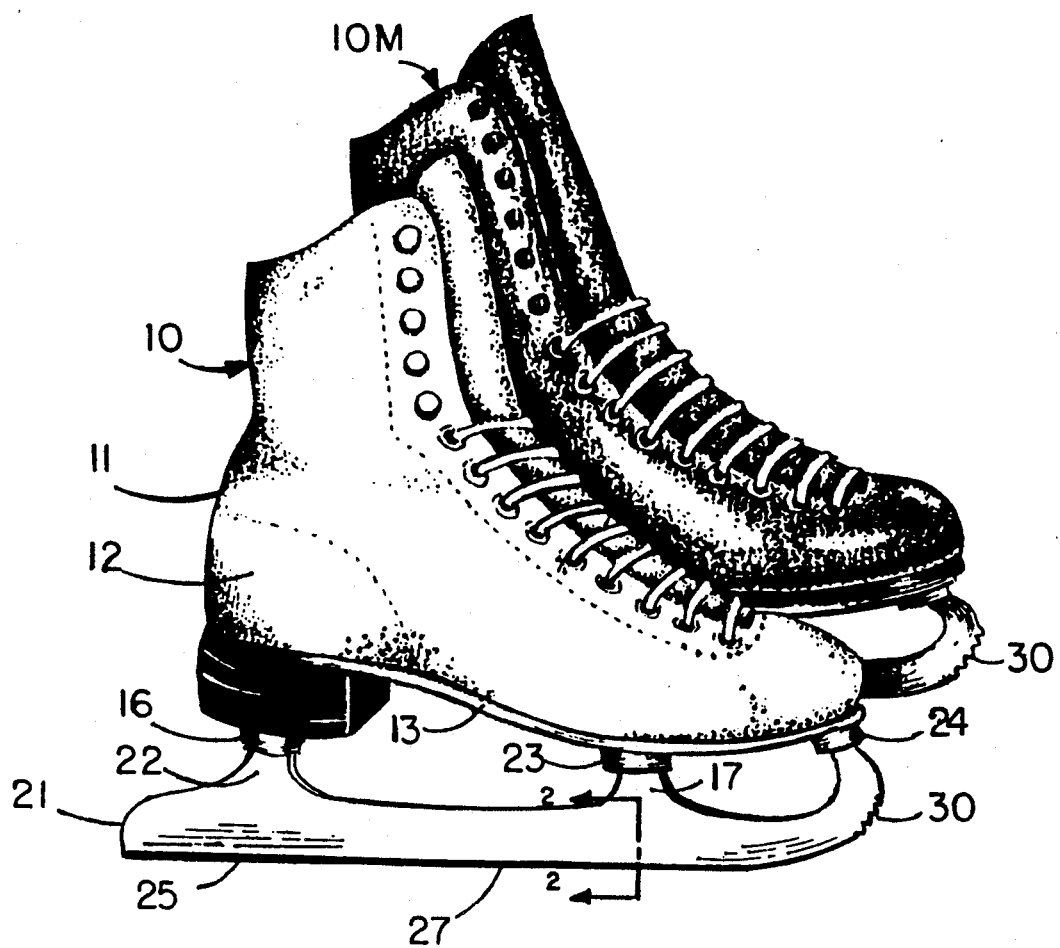
FIG. 1 is an isometric view of ice skates embodying the invention.

While the skates shown in FIG. 1 are so-called racing skates, hockey and figure skates employing different blade assembly constructions may be similarly protected by synthetic diamond and, if employed thereon, chromium or other protective overcoatings extending just along the lower portion of the blade or the flat portion of the entire blade of the blade assembly which may include a tubular metal stamping or assembly for supporting and fastening the blade to the shoe.

In a modified form of the invention, the entire plastic or leather side wall 12 of the skate shoe or boot 11 may be coated with a thin layer of synthetic diamond material formed in situ thereon by chemical vapor deposition as described to a thickness in the range of 0.0001" to 0.001" or more and utilized per se to protect the outer surface of the shoe from scuffing, abrasion, moisture and chemical attack from atmospheric pollutants. Such synthetic diamond layer may be utilized per se against the entire outer surface of the shoe as a scuff resistant, water proofing and insulating layer or may be protected and lubricated with hard wax or plastic applied as a thin layer or film to the outer surface thereof. Such polymers as polyethylene, polyurethane, polyester, polycarbonate or other synthetic resin may be applied to the outer surfaces of the plastic or leather side walls as well as the side and bottom walls of the sole and heel of the shoe after the synthetic diamond material has been applied thereto in suitable thickness or thicknesses to provide waterproofing, heat insulation, surface strength abrasion and tear resistance wherein the shoe and skate blade will exhibit superior wear resistance, durability and heat insulation imparted either by the diamond film per se or a combination of the diamond layer and plastic overcoating thereon.

In another form of the invention, both the shoe 11 and blade assembly 20 may be molded of plastic and may be joined together after molding or comolded together of the same or different plastic materials. The entire shoe and blade portions of the skate may also have their entire outer surfaces coated with synthetic diamond material with or without an overcoating as described above. Hard wax applied to such synthetic diamond coating may suffice to protect it against abrasion and wear as may a thin film of plastic spray or vapor deposited thereon.

Leather and plastic sheet materials may be similarly treated and coated with synthetic diamond film with or without a wax or plastic overcoating to define or cover and variety of products subject to scuffing or wear and/or requiring sealing against moisture and chemical attack.

In FIG. 2 is shown structural details of the synthetic diamond coatings, the protective overcoatings and the substrates coated. The substrate, which may be any of the configurations hereinabove described, is denoted 50 and is made of suitable metal, metal alloy, ceremet or ceramic material or combinations thereof fabricated by casting, molding, extrusion, machining, forging or one or more of such processes. The synthetic diamond coating 51 may be deposited as carbon atoms stripped from molecules of such gas as methane or other hydrocarbon, vaporous hydrocarbon or carbon atom containing material, combinations of gas and vapor carbon atom containing materials, preferably with suitable hydrogen gas mixed therewith to provide suitably efficient deposition and synthetic diamond layer formation to the desired thickness which may vary in the range of 0.000001" to 0.010" and, for most applications in the range of a few millions of an inch to a few thousandths of an inch. The overcoating 52 of chromium is shown completely covering the synthetic diamond coating 51 and may be applied by electroless or electrical deposition, vapor deposition, detonation or plasma plating. Thickness of depths of such overcoating may range from 0.0001 to several thousands of an inch or more and preferably in the range of a few thousands of an inch or less.

The coatings of synthetic hard diamond or diamond-like material applied to the entire articles or select portions of such articles subjected to frictional wear, weathering, temperature or chemical corrosive effects, and destruction caused by the expansion of surface defects such as surface cracks formed during fabrication, may be formed of carbon atoms deposited thereon from gas, vapor or liquid molecules containing such carbon atoms, as a result of passing high intensity radiation, such as microwave radiation or the like, through such carbon atom containing fluids, by means shown and described in any parent application Ser. No. 32,307, now U.S. Pat. No. 4,859,493, in thicknesses which may vary from a few millionths of an inch to a thousandth of an inch or more depending on the expected use of the articles or assemblies including the corrosive and erosive atmosphere to which they are subjected. Thicker films in the order of 0.0001" to 0.001" or more may be provided to substantially enhance the tensile and compressive strengths of the articles or components. Where the article or component is subjected to movement and abrasion or frictional wear during use, which wear or abrasion or frictional wear during use, which wear or abrasion may have a detrimental effect on the diamond film or coating, a thin coating of a solid lubricant protective material, such as chromium, chromium alloys or the like, may be applied over the diamond coating after it is formed in situ on the substrate or select portion of the outer surface thereof. Such chromium may also be deposited as chromium atoms present in the gas, vapor or liquid disposed adjacent the surface of the article, while carbon atoms are deposited or sequentially after the deposition of carbon atoms to provide either a composite layer of carbon and chromium atoms or one or more layers of carbon atoms interposed between one or more layers of chromium atoms or coatings thereof.

What is claimed is:

1. An ice skate assembly comprising in combination:
   (a) a support including means for retaining said support securely against a foot of a person, (b) an elongated skate blade secured to said support and located thereon to extend longitudinally below the bottom of the foot of a person against which said support is operatively retained, (c) said blade having an elongated runner portion extending substantially the length of said blade and defining the lower portion thereof for supporting said blade in sliding engagement on ice, (d) said runner portion having substantially parallel side wall surfaces and a narrow bottom surface joined to and extending from said parallel side wall surfaces, (e) said bottom and side wall surfaces of said runner portion defining a pair of spaced-apart parallelly extending elongated left and right edge portions of said runner portion of said blade, (f) a layer of synthetic diamond material coating the runner portion of said blade including select portions of said parallel side wall surfaces, said narrow bottom surface and parallelly extending left and right edge portions thereof and serving to protect said blade from frictional wear, said synthetic diamond material defining said left and right edge portions of said blade.

2. An ice skate assembly in accordance with claim 1 wherein said layer of synthetic diamond material is an in situ coating bonded to said runner portion of said skate blade.

3. An ice skate assembly in accordance with claim 1 wherein said layer of synthetic diamond material has a thickness in the range of 0.00001" to 0.001".

4. An ice skate assembly in accordance with claim 1 wherein said layer of synthetic diamond material has a thickness in the range of 0.001" to 0.005".

5. An ice skate assembly in accordance with claim 1 having an outer coating of solid lubricating material overlying and deposited against the outer surface of said coating of synthetic diamond material and selected from the group of metals comprising chromium, vanadium, titanium, aluminum, molybdenum and tungsten and alloys thereof.

6. An ice skate assembly in accordance with claim 1 wherein said synthetic diamond material extends against and is integrally bonded to the entire outer surface of said elongated skate blade.

7. An ice skate assembly in accordance with claim 1, further including a plurality of supports for said skate blade, said plurality of supports being fastened to said blade and to said support for retaining said skate against the foot of a person, said supports and said skate blade being coated with said synthetic diamond material.

8. An ice skate assembly in accordance with claim 1, said support and said skate blade defining an assembly of metal elements, said assembly being coated with said synthetic diamond material.

9. An ice skate assembly in accordance with claim 1 formed of an assembly of rigid elements including said blade, said blade being removable from said assembly to permit its replacement.

10. An ice skate assembly in accordance with claim 1 wherein said support is in the form of a shoe, at least a portion of said shoe and said skate blade being integrally formed by molding same of rigid plastic material.

11. An ice skate assembly in accordance with claim 10 having a coating of synthetic diamond material applied to the outside surface of said shoe for protecting same against scuffing, moisture penetration and heat transfer across the wall of said shoe.

12. An ice skate assembly in accordance with claim 11 including a coating of protective material for lubricating and protecting the outer surface of said diamond material coating the walls of said shoe, said protective material selected from the group of materials including waxes, polymers and copolymers, metals and metal alloys of chromium, vanadium, titanium, aluminum, molybdenum and tungsten.

13. An ice skate blade for use in assembly with an ice skate to be secured to the foot of a person for ice skating therewith comprising:

(a) an elongated narrow rigid strip of metal having flat parallel side walls and a bottom wall extending between the lower extremities of an joining said parallel side walls, (b) parallelly extending left and right edges of said strip formed between a respective of said side walls and said bottom wall, (c) a coating formed of synthetic diamond material integrally bonded to said strip and extending along and between said bottom wall and said side walls, (d) said synthetic diamond coating having respective left and right edge portions extending parallel to each other and to said parallel left and right edges of said elongated rigid metal strip and defining the operating edges of said skate blade.

14. An ice skate blade in accordance with claim 13 including a thin layer of protective material overcoating said coating of synthetic diamond material.

15. An ice skate blade in an assembly with an ice skate used in skating comprising:

(a) an elongated narrow strip or rigid material having closely spaced parallel side wall portions and a bottom wall extending between and joining said side wall portions, (b) a pair of parallelly extending left and right edges formed between said bottom wall and said side walls of said strip of rigid material, (c) a coating of hard synthetic diamond material integrally bonded to said bottom wall and said side walls of said strip, and (d) said synthetic diamond coating having respective left and right edge portions extending parallel to each other and said parallel left and right edges of said strip and defining the operating edges of said skate blade.

* * * * *